United States Patent
Miyata

(10) Patent No.: US 7,858,272 B2
(45) Date of Patent: Dec. 28, 2010

(54) EXPOSURE MASK AND METHOD FOR FABRICATING THIN-FILM TRANSISTOR

(75) Inventor: Takashi Miyata, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 12/206,592

(22) Filed: Sep. 8, 2008

(65) Prior Publication Data

US 2009/0111251 A1 Apr. 30, 2009

(30) Foreign Application Priority Data

Oct. 29, 2007 (JP) ............................. 2007-279959

(51) Int. Cl.
*G03F 1/00* (2006.01)
(52) U.S. Cl. ........................................ 430/5; 430/311
(58) Field of Classification Search ................ 430/5, 430/311–313, 321–323; 438/149, 155
See application file for complete search history.

(56) References Cited

U.S. PATENT DOCUMENTS

2005/0250050 A1* 11/2005 Chen et al. ................. 430/313
2006/0099521 A1* 5/2006 Park et al. ..................... 430/5
2007/0037070 A1* 2/2007 Ohnuma et al. ............... 430/5
2009/0127596 A1* 5/2009 Sera et al. ................... 257/288

FOREIGN PATENT DOCUMENTS

| JP | A 08-250446 | 9/1996 |
| JP | A 2002-151523 | 5/2002 |
| JP | A 2006-054424 | 2/2006 |
| JP | A 2007-072452 | 3/2007 |
| JP | A 2007-103418 | 4/2007 |

* cited by examiner

*Primary Examiner*—Mark F Huff
*Assistant Examiner*—Stewart A Fraser
(74) *Attorney, Agent, or Firm*—Oliff & Berridge, PLC

(57) ABSTRACT

An exposure mask includes a transparent substrate; a first pattern portion formed on the transparent substrate using at least one light-shielding pattern having a predetermined shape; and a translucent layer which is formed at a section including a first pattern region having the first pattern portion, which allows exposure light to pass therethrough, and which has a transmittance greater than that of the light-shielding pattern.

10 Claims, 7 Drawing Sheets

EXPOSURE MASK AND METHOD FOR FABRICATING THIN-FILM TRANSISTOR

BACKGROUND

1. Technical Field

The present invention relates to an exposure mask for use in a photolithographic step and also relates to a method for fabricating a thin-film transistor using the exposure mask.

2. Related Art

An example of an exposure mask (that is, a photomask) is a gradient mask (or a multiple-gradient mask) in which the transmittance of exposure light varies at three or more levels. The gradient mask is useful in forming a gradient resist film having a plurality of regions with different thicknesses. The use of the gradient mask is effective in reducing the number of, for example, photolithographic steps of processes for fabricating thin-film transistors.

Japanese Unexamined Patent Application Publication No. 8-250446 (hereinafter referred to as Patent Document 1) discloses an exposure mask (gray tone mask) which is an example of the gradient mask. This exposure mask includes a chromium layer having portions which have different thicknesses and therefore have different transmittances for exposure light. Japanese Unexamined Patent Application Publication Nos. 2002151523 (hereinafter referred to as Patent Document 2) and 2007-72452 (hereinafter referred to as Patent Document 3) each disclose an exposure mask that has a striped pattern (a slit pattern or a grating pattern) or a dotted pattern such that portions thereof have different transmittances for exposure light.

In the exposure mask disclosed in Patent Document 1, the chromium layer needs to be formed so as to have such portions which have different thicknesses and therefore have different transmittances for exposure light. Since it is difficult to form the chromium layer such that the portions thereof have desired thicknesses, there is a problem in that the exposure mask may have undesired transmittances. There is also a problem in that the cost of manufacturing the exposure mask is high because the chromium layer needs to be precisely formed so as to have desired thicknesses. Alternatively, if exposure light is applied to a resist layer through the exposure mask disclosed in Patent Document 2 or 3, a pattern corresponding to the striped or dotted pattern is formed on the resist layer, that is, the striped or dotted pattern is transferred to the resist layer. This causes a problem in that the resulting resist layer has surface irregularities. In particular, exposure light with a shorter wavelength is likely to cause the transfer of the striped or dotted pattern to the resist layer.

SUMMARY

An advantage of an aspect of the invention is to provide an exposure mask and a method for fabricating a thin-film transistor using the exposure mask. The exposure mask is capable of precisely forming a gradient resist film.

An exposure mask according to the present invention includes a transparent substrate; a first pattern portion formed on the transparent substrate using at least one light-shielding pattern having a predetermined shape; and a translucent layer which is formed at a section including a first pattern region having the first pattern portion, which allows exposure light to pass therethrough, and which has a transmittance greater than that of the light-shielding pattern.

The exposure mask is used in a photolithographic step of a process for fabricating a thin-film transistor. The exposure mask is formed in the form of a gradient mask in which the transmittance of the exposure light emitted from an exposure system varies stepwise.

In the exposure mask, the transparent substrate is made of quartz glass or the like, the light-shielding pattern is made of chromium or the like and is disposed on the transparent substrate, and the translucent layer is made of chromium oxide or the like and is disposed on the translucent layer.

The light-shielding pattern forms, for example, a striped portion located at the first pattern region disposed on the transparent substrate, the first pattern portion that is a dotted repeating portion, and a second pattern portion extending over a second pattern region (typically a region adjacent to the first pattern portion) which is disposed on the transparent substrate and which is different from the first pattern region.

The transmittance of exposure light passing through the translucent layer is greater than that of exposure light passing through the light-shielding pattern. The translucent layer is formed at the section (for example, the first and second regions) including the first pattern region having the first pattern portion so as to extend over the light-shielding pattern. The translucent layer may be formed under the light-shielding pattern, which is included in a multilayer structure disposed on the transparent substrate (that is, the translucent layer may be formed between the transparent substrate and the light-shielding pattern).

This allows the transmittance of exposure light passing through the first pattern region, which is disposed on the transparent layer, to be different from the transmittance of exposure light passing through a region (for example, the second pattern region) which is different from the first pattern region and which is one of regions having portions of the light-shielding pattern disposed on the transparent layer. Therefore, the exposure mask according to the present invention can function as a gradient mask.

According to the present invention, the translucent layer extends over the section including the first pattern region. Therefore, it can be avoided or prevented that when exposure light is applied to a resist layer (or a photoresist layer, that is, a layer of a photosensitive material applied to the substrate) through the exposure mask, a pattern corresponding to the light-shielding pattern is transferred to the resist layer and therefore the resist layer has surface irregularities (in other words, a surface of the resist layer has a wavy shape). That is, a surface region of the resist layer that corresponds to the first pattern region can be kept flat.

In other words, according to the present invention, the translucent layer extends over zones (for example, in the case where the light-shielding pattern has a striped pattern in which a plurality of line-shaped light-shielding portions are arranged in the first pattern region at a predetermined distance, zones located between the line-shaped light-shielding portions adjacent to each other) of the first pattern region that have no portions of light-shielding pattern. This allows the following difference to be small: the difference between the transmittance of exposure light passing through the zones of the first pattern region that have no portions of light-shielding pattern and the transmittance of exposure light passing through zones of the first pattern region that have portions of light-shielding pattern. Therefore, a pattern corresponding to the light-shielding pattern can be prevented from being transferred to the resist layer.

The exposure mask according to the present invention can function as a preferable gradient mask and therefore is effective in precisely forming a gradient resist film.

In the exposure mask, the translucent layer preferably has an extending portion extending from a portion which is disposed on the transparent substrate and which overlaps with a region having the light-shielding pattern to at least one portion of a region which is disposed on the transparent substrate and which has no light-shielding pattern.

The region having the light-shielding pattern has a portion of the translucent layer. However, a region having the extending portion has no light-shielding pattern. This allows the transmittance of exposure light passing through the region having the light-shielding pattern to be different from the transmittance of exposure light passing through the region having the extending portion. This also allows the transmittance of exposure light passing through a region which is disposed on the transparent layer and which has no light-shielding pattern or translucent layer to be different from the transmittance of exposure light passing through the region having the extending portion. The number of steps at which the transmittance of exposure light passing through the exposure mask varies can be increased.

In the exposure mask, the light-shielding pattern preferably has a second pattern portion which is different from the first pattern portion and which is located at a second pattern region which is different from the first pattern region and which is disposed on the transparent substrate.

The second pattern portion of the light-shielding pattern is located at the second pattern region, which is disposed on the transparent substrate. The second pattern portion thereof has a second pattern, such as a solid pattern, a striped pattern, or a dotted pattern, different from a first pattern. This allows the transmittance of exposure light passing through the first pattern region to be different from the transmittance of exposure light passing through the second pattern region. Therefore, the number of steps at which the transmittance of exposure light passing through the exposure mask varies can be increased.

In the exposure mask, the first pattern portion preferably corresponds to a striped or dotted repeating portion of the light-shielding pattern.

The light-shielding pattern can be readily formed using the first pattern portion. This leads to an increase in the reliability of the exposure mask.

In the exposure mask, the area ratio of the second pattern portion to the second pattern region is preferably greater than the area ratio of the first pattern portion to the first pattern region.

In the exposure mask, the second pattern portion preferably extends over the second pattern region.

A method for fabricating a thin-film transistor according to the present invention includes a step of forming a gradient resist film by exposing a resist layer disposed on a semiconductor layer to exposure light through the exposure mask according to the present invention and a step of implanting impurity ions into the semiconductor layer through the gradient resist film.

In the thin-film transistor-fabricating method according to the present invention, the resist layer is exposed to light through the exposure mask according to the present invention; hence, a gradient resist film can be precisely formed. Therefore, the concentration of the impurity ions in the semiconductor layer can be precisely controlled in the step of implanting the impurity ions into the semiconductor layer through the gradient resist film.

The thin-film transistor-fabricating method according to the present invention further includes a step of etching the semiconductor layer using the gradient resist film.

In this step, the gradient resist film can be used as a mask for etching the semiconductor layer. The method according to the present invention includes a smaller number of photo-lithographic steps as compared to a method that uses a resist layer, serving as a mask, for etching the semiconductor layer in addition to the gradient resist film.

Advantages and gains of the present invention will become apparent from the description of exemplary embodiments below.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the present invention will now be described with reference to the accompanying drawings. In each embodiment, an exposure mask according to the present invention is described using a photomask, for use in a process for fabricating a thin-film transistor (hereinafter referred to as "TFT") having a lightly doped drain (LDD) structure, as an example.

First Embodiment

A photomask according to a first embodiment will now be described with reference to FIGS. 1 to 3.

The configuration of the photomask is described with reference to FIGS. 1 and 2. FIG. 1 is a schematic plan view of the photomask. FIG. 2 is a sectional view of the photomask taken along the line II-II of FIG. 1. In FIGS. 1 and 2, in order to show members on a recognizable scale, different scales are used depending on the size of the members. This applies to FIG. 3 and the drawings subsequent thereto.

Figure 1:
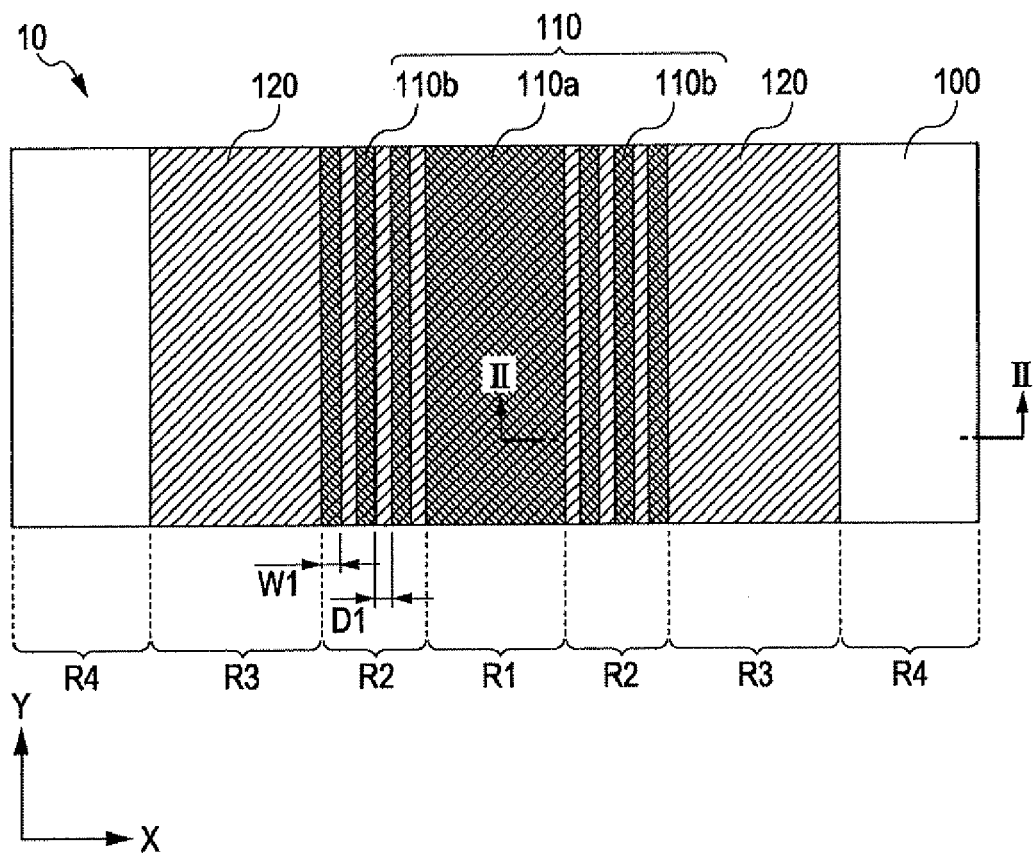
FIG. 1 is a schematic plan view of a photomask according to a first embodiment of the present invention.
Figure 2:
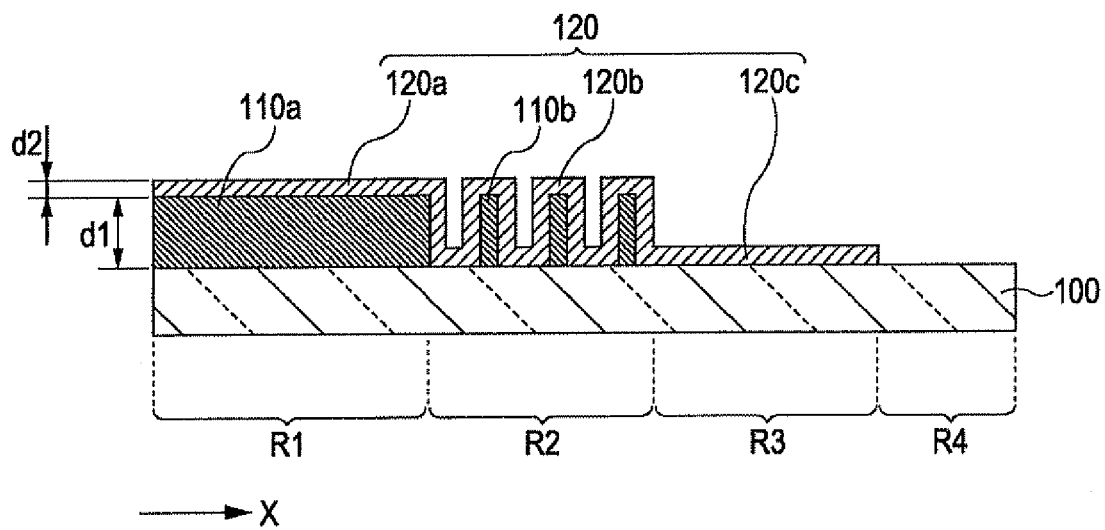
FIG. 2 is a sectional view of the photomask taken along the line II-II of FIG. 1.

With reference to FIGS. 1 and 2, the photomask 10 includes a transparent substrate 100, a light-shielding pattern 110, and a translucent layer 120.

The transparent substrate 100 is made of, for example, quartz glass.

The light-shielding pattern 110 is made of chromium and includes a first regional portion 110*a* and second regional portions 110*b*. The first regional portion 110*a* is disposed in a first region R1 lying on the transparent substrate 100 and the second regional portions 110*b* are disposed in second regions R2 lying on the transparent substrate 100. The first region R1 is defined as a rectangular region centrally located on the transparent substrate 100 when the transparent substrate 100 is viewed in the longitudinal direction thereof (that is, in the X direction). The second regions R2 are defined as rectangular regions located on both sides of the first region R1. The first regional portion 110*a* is an example of "a second pattern portion" specified herein and the second regional portions 110*b* are examples of "a first pattern portion" specified herein. The first regional portion 110*a* is disposed in the first region R1 and has a solid pattern. The second regional portions 110*b* are arranged in the second regions R2 and have a striped pattern (that is, a pattern in which a plurality of line-shaped light-shielding portions having a width W1 are spaced from each other at a distance D1).

The thickness d1 of the light-shielding pattern 110 ranges from 70 to 150 nm and is, for example, 120 nm. The second regional portions 110*b* each include a plurality of line-shaped light-shielding zones which have a width W1 of 0.5 µm and which are spaced from each other at a distance D1 of 1.0 µm. In other words, the second regional portions 110*b* have a pattern in which the line-shaped light-shielding zones, which have a width W1 of 0.5 µm, are arranged at a pitch of 1.5 µm.

The light-shielding pattern 110 is made of chromium as described above and may be made of, for example, chromium nitride.

The translucent layer 120 is made of chromium oxide and extends over the light-shielding pattern 110 and regions of the transparent substrate 100.

The translucent layer 120 includes a first regional section 120*a* disposed above the first region R1, second regional sections 120*b* each extend over one of the second regions R2, and third regional sections 120*c* each disposed on one of third regions R3. The third regions R3 are defined as rectangular regions sandwiching the first and second regions R1 and R2 (that is, rectangular regions located outside the second regions R2). The thickness d2 of the translucent layer 120 ranges from 10 to 20 nm and is, for example, 10 nm. The translucent layer 120 has a higher transmittance for exposure light, such as an i-line (that is, light with a wavelength of 365 nm) or a g-line (that is, light with a wavelength of 435 nm), used in photolithographic steps of processes for fabricating TFTs as compared to the light-shielding pattern 110.

Fourth regions R4 are defined as rectangular regions which are disposed on the transparent substrate 100 and which are located outside the third regions R3. The fourth regions R4 are not covered with the light-shielding pattern 110 or the translucent layer 120.

That is, the photomask 10 includes the first region R1, the second regions R2, the third regions R3, and the fourth regions R4. The first region R1 has a multilayer structure in which the first regional portion 110*a* of the light-shielding pattern 110 and the first regional section 120*a* of the translucent layer 120 are arranged in that order. The second regions R2 have a configuration in which the second regional sections 120*b* of the translucent layer 120 extend over the second regional portions 110*b* of the light-shielding pattern 110. The third regions R3 have a configuration in which the third regional sections 120*c* of the translucent layer 120 are present on the transparent substrate 100 in the form of monolayers. The fourth regions R4 have a configuration in which portions of the transparent substrate 100 are not covered with the light-shielding pattern 110 or the translucent layer 120. The photomask 10 allows the first region R1, the second regions R2, the third regions R3, and the fourth regions R4 to have different transmittances for exposure light (in particular, the first region R1, the second regions R2, the third regions R3, and the fourth regions R4 can be arranged in ascending order of transmittance for exposure light, that is, the transmittance of the second regions R2 and that of the third regions R3 can be varied stepwise such that the first region R1 has the lowest transmittance and the fourth regions R4 have the highest transmittance for exposure light). Therefore, the photomask 10 can function as a gradient mask.

Advantages of the photomask 10 will now be described with reference to FIGS. 1 to 3. FIG. 3 is a sectional view of a gradient resist film 600 formed using the photomask 10.

Figure 3:
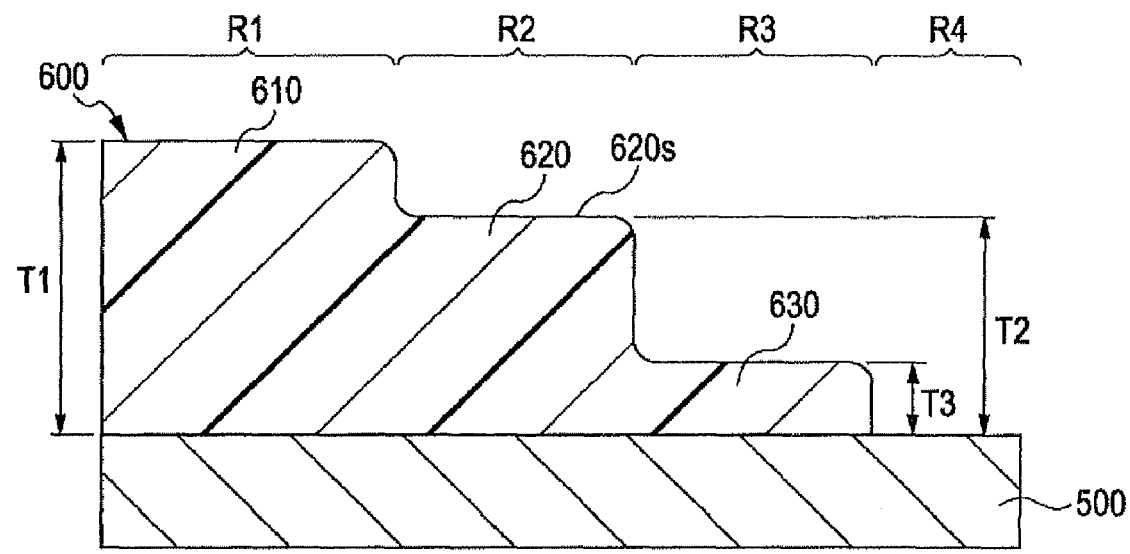
FIG. 3 is a schematic sectional view of a gradient resist film formed by exposing a resist layer to light through the photomask according to the first embodiment.

As shown in FIG. 3, the gradient resist film 600 can be formed in such a manner that a resist layer is formed by applying a positive-type photosensitive material to a substrate 500, exposed to light through the photomask 10, and then developed. In this procedure, the resist layer, which is disposed on the substrate 500, is exposed to light such that portions overlapping with the fourth regions R4 of the photomask 10 are entirely removed from the resist layer by developing.

The gradient resist film 600 includes a first section 610 overlapping with the first region R1 of the photomask 10, second sections 620 overlapping with the second regions R2 of the photomask 10, and third sections 630 overlapping with the third regions R3 of the photomask 10. The first section 610 and the second sections 620 are examples of "a section overlapping with a region having a light-shielding pattern" specified herein. The third sections 630 are examples of "an extending portion" specified herein.

The thickness T1 of the first section 610 is greater than the thickness T2 of the second sections 620 and the thickness T3 of the third sections 630; hence, the first region R1 of the photomask 10 has a transmittance less than that of the second, third, and fourth regions R2, R3, and R4.

The thickness T2 of the second sections 620 is greater than the thickness T3 of the third sections 630; hence, the second regions R2 of the photomask 10 have a transmittance less than that of the that of the third and fourth regions R3 and R4.

The third sections 630 can be formed so as to have a desired thickness T3 and the portions overlapping with the fourth regions R4 of the photomask 10 are entirely removed; hence, the third regions R3 of the photomask 10 have a transmittance less than that of the fourth regions R4 thereof.

As described above with reference to FIGS. 1 and 2, the second regional sections 120*b* of the translucent layer 120 extend over the second regional portions 110*b* of the light-shielding pattern 110. In the step of forming the gradient resist film 600 using the photomask 10 as shown in FIG. 3, it can therefore be avoided or prevented that the striped pattern of each second regional portion 110*b* of the light-shielding pattern 110 is transferred to the second sections 620 of the gradient resist film 600 and therefore surfaces 620*s* of the second sections 620 have irregularities (that is, the surfaces 620*s* have a wavy shape). In other words, the surfaces 620*s* of the second sections 620 can be kept flat. That is, the first, second, and third sections 610, 620, and 630 of the gradient resist film 600 can be formed so as to have improved surface flatness. Therefore, the gradient resist film 600 can be precisely formed.

Since the photomask 10 can function as a gradient mask, the gradient resist film 600 can be precisely formed as described above.

Second Embodiment

Figure 4:
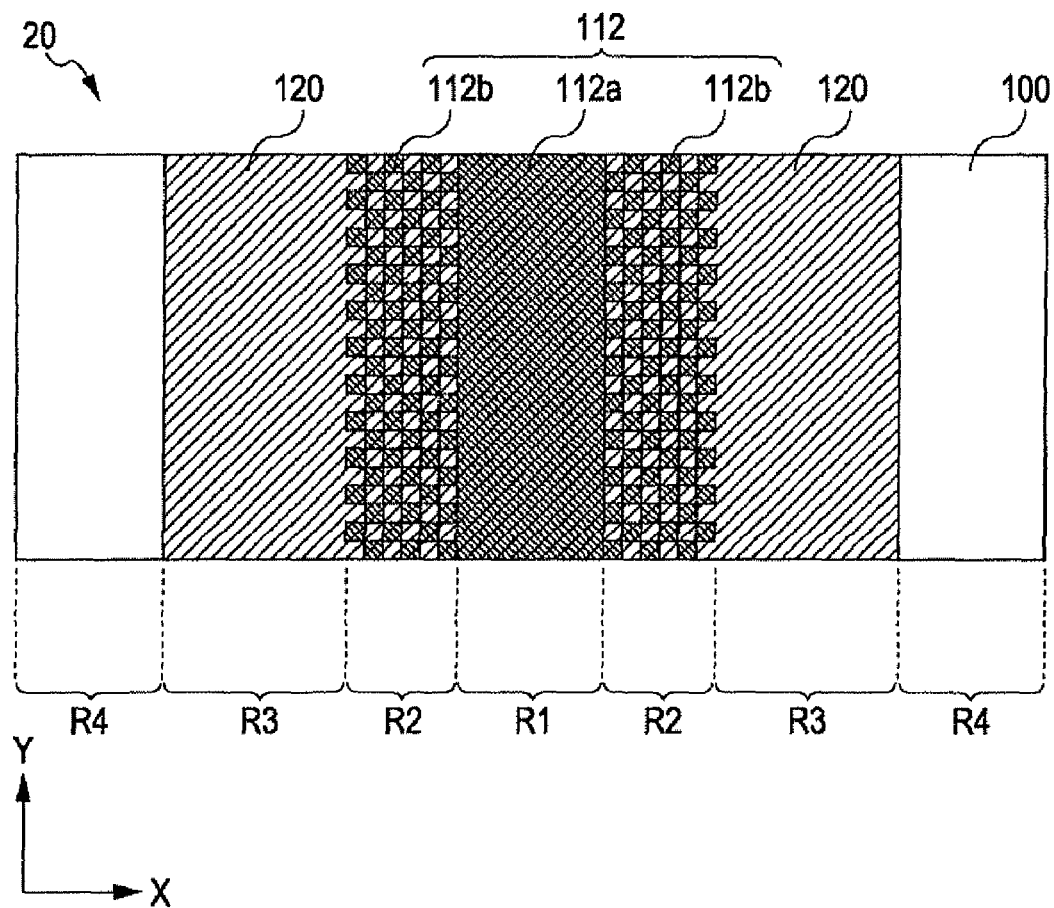
FIG. 4 is a schematic plan view of a photomask according to a second embodiment of the present invention.

A photomask 20 according to a second embodiment of the present invention will now be described with reference to FIG. 4. FIG. 4 is schematic plan view of the photomask 20. In FIG. 4, the same members as those shown in FIGS. 1 to 3 are denoted by the same reference numerals as those shown in FIGS. 1 to 3 and will not be described in detail.

The photomask 20 according to the second embodiment has substantially the same configuration as that of the photomask 10 according to the first embodiment except that the photomask 20 according to the second embodiment includes a light-shielding pattern 112 instead of the light-shielding pattern 110 described in the first embodiment.

The light-shielding pattern 112 is made of chromium and includes a first regional portion 112a and second regional portions 112b. The first regional portion 112a is disposed in a first region R1 lying on a transparent substrate 100 and the second regional portions 112b are disposed in second regions R2 lying on the transparent substrate 100. The first regional portion 112a is disposed in the first region R1 and has a solid pattern. The second regional portions 112b are arranged in second regions R2 and have a dotted pattern (that is, a pattern in which a plurality of dotted light-shielding portions are arranged).

The thickness of the light-shielding pattern 112 ranges from 70 to 150 nm and is, for example, 120 nm. The light-shielding pattern 112 may be made of, for example, chromium nitride.

A translucent layer 120 is made of chromium oxide and extends over the light-shielding pattern 112, which is disposed on the transparent substrate 100. The translucent layer 120 includes a first regional section 120a disposed above the first region R1, second regional sections 120b disposed on the second regions R2, and third regional sections 120c disposed on third regions R3.

The photomask 20, as well as the photomask 10 according to the first embodiment, allows the first region R1, the second regions R2, the third regions R3, and fourth regions R4 to have different transmittances for exposure light. Therefore, the photomask 20 can function as a gradient mask.

In this embodiment, the translucent layer 120 extends over the second regional portions 112b of the light-shielding pattern 112. Therefore, it can therefore be avoided or prevented during the formation of a gradient resist film using the photomask 20 that the dotted pattern of each second regional portion 112b of the light-shielding pattern 112 is transferred to the gradient resist film and therefore the gradient resist film has surface irregularities.

Third Embodiment

A third embodiment of the present invention provides a method for fabricating a thin-film transistor using the photomask 10 according to the first embodiment. The method is described below with reference to FIGS. 5 to 9. FIGS. 5 to 9 are sectional views illustrating steps of the method, which is used to fabricate the thin-film transistor.

Figure 5:
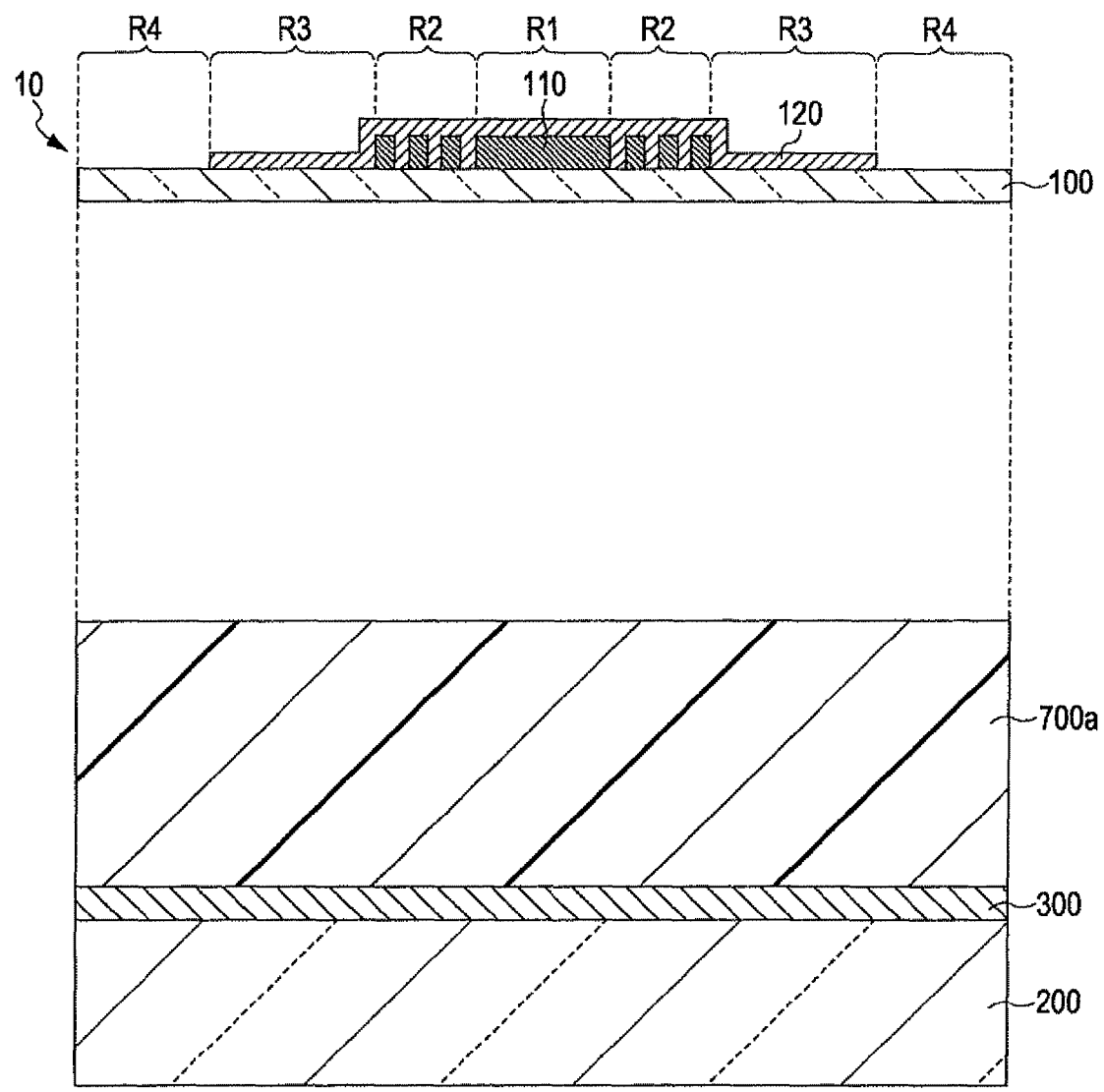
FIG. 5 is sectional view illustrating a step of a method for fabricating a thin-film transistor using the photomask according to the first embodiment.

In a step shown in FIG. 5, a semiconductor layer 300 made of polysilicon or the like is deposited over an element substrate 200 such as a quartz substrate or a glass substrate by a vacuum chemical vapor deposition (CVD) process or the like. A positive-type resist layer 700a is formed over the semiconductor layer 300. The resist layer 700a is irradiated with exposure light through the photomask 10 using an exposure system (that is, the resist layer 700a is exposed to light through the photomask 10).

Figure 6:
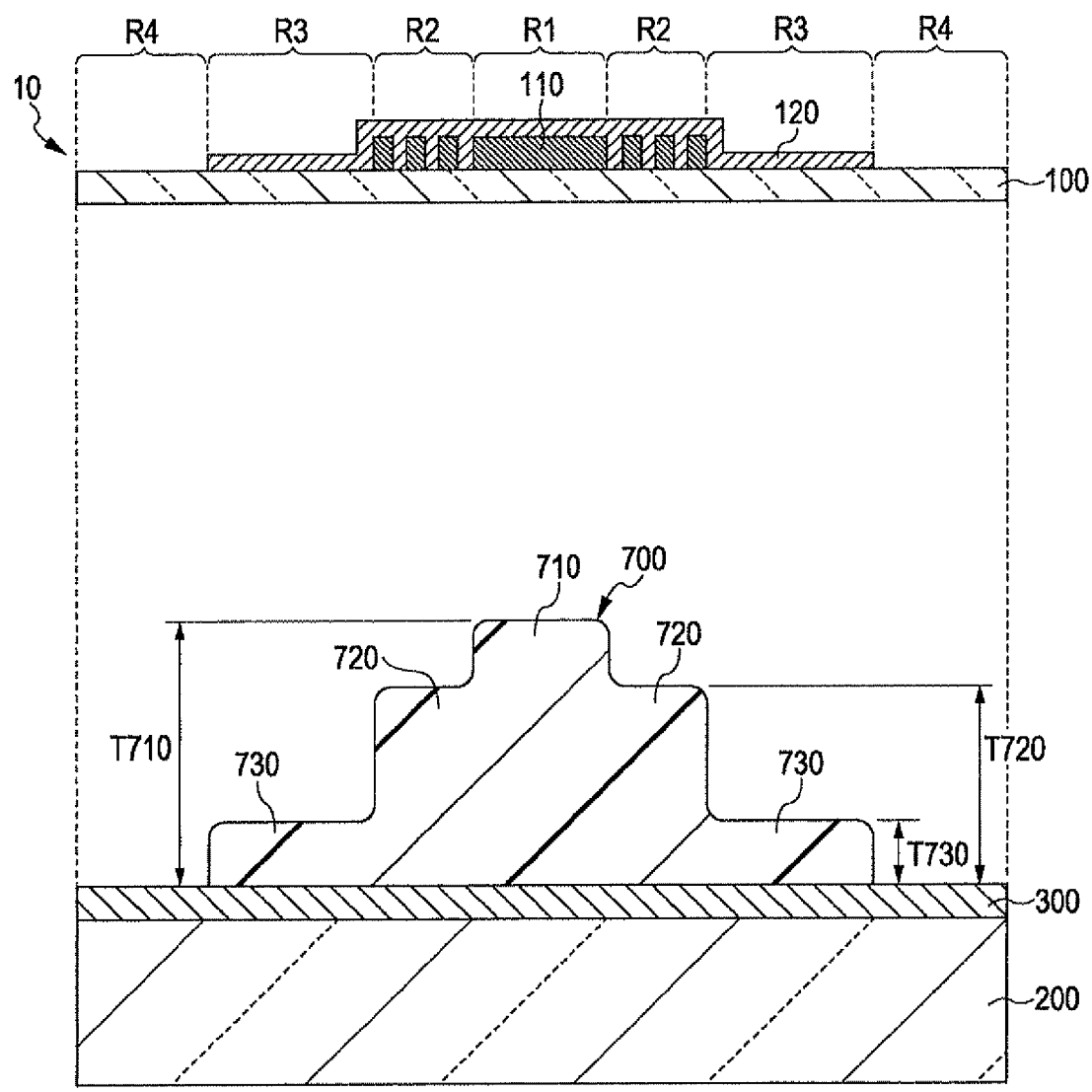
FIG. 6 is sectional view illustrating a step of a method for fabricating a thin-film transistor using the photomask according to the first embodiment.

In a step shown in FIG. 6, the resist layer 700a exposed to light through the photomask 10 is developed, whereby a gradient resist film 700 is formed.

In this step, the resist layer 700a is exposed to light and then developed such that portions overlapping with the fourth regions R4 of the photomask 10 are entirely removed from the resist layer 700a (see FIG. 5). The gradient resist film 700 formed as described above includes a first section 710 overlapping with the first region R1 of the photomask 10, second sections 720 overlapping with the second regions R2 of the photomask 10, and third sections 730 overlapping with the third regions R3 of the photomask 10. The thickness T710 of the first section 710 is greater than the thickness T720 of the second sections 720 and the thickness T730 of the third sections 730; hence, the first region R1 of the photomask 10 has a transmittance less than that of the second, third, and fourth regions R2, R3, and R4. The thickness T720 of the second sections 720 is greater than the thickness T730 of the third sections 730; hence, the second regions R2 of the photomask 10 has a transmittance less than that of the that of the third and fourth regions R3 and R4.

Figure 7:
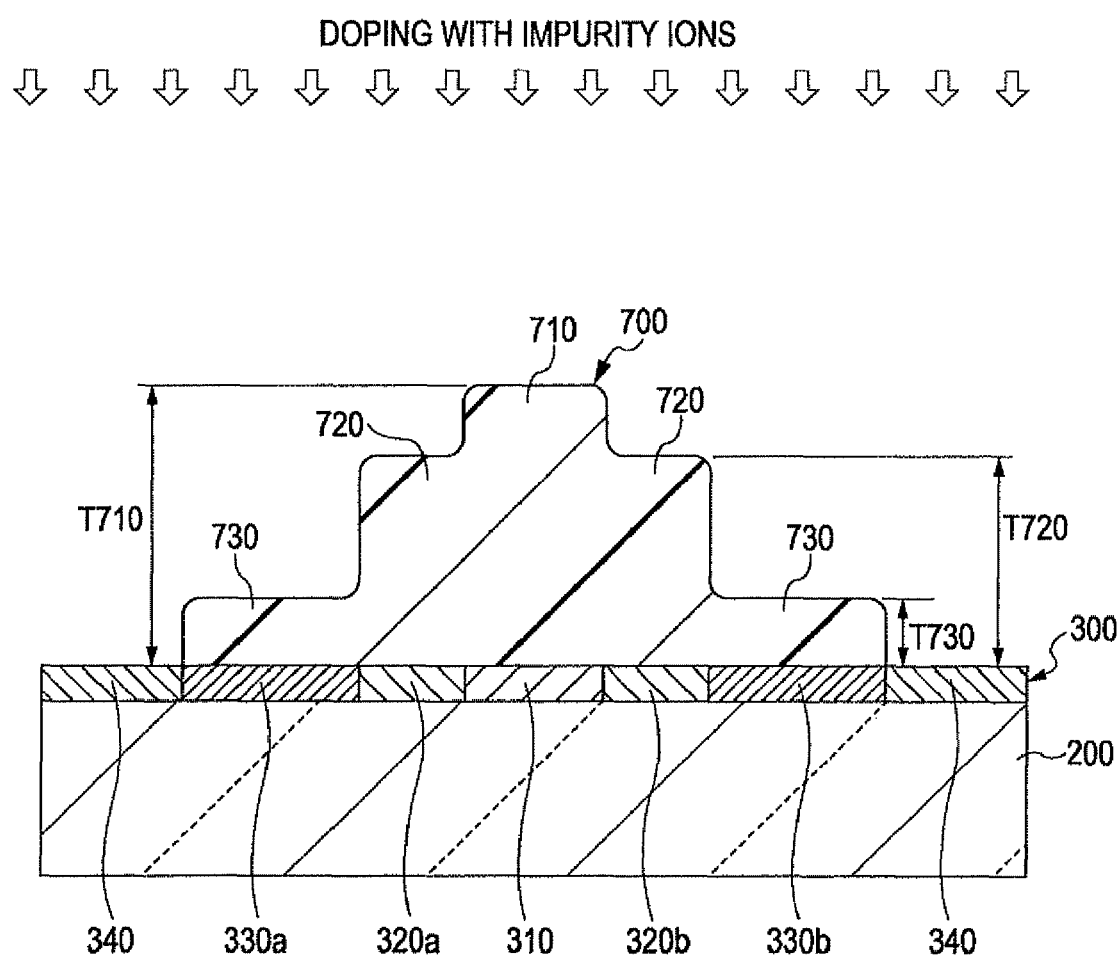
FIG. 7 is sectional view illustrating a step of a method for fabricating a thin-film transistor using the photomask according to the first embodiment.

In a step shown in FIG. 7, the semiconductor layer 300 is doped with p-type impurity ions such as boron (B) ions at a predetermined dose using the gradient resist film 700. This allows a channel region 310, lightly doped source/drain regions 320 (that is, a lightly doped source region 320a and a lightly doped drain region 320b), and heavily doped source/drain regions 330 (a heavily doped source region 330a and a heavily doped drain region 330b) to be formed in the semiconductor layer 300. Since the gradient resist film 700 includes the first, second, and third sections 710, 720, and 730 that have different thicknesses, the channel region 310, the lightly doped source/drain regions 320, and the heavily doped source/drain regions 330 are different from each other in the concentration of the impurity ions. In particular, the channel region 310 is doped with no p-type impurity ions, because the channel region 310 overlaps with the first section 710, which has the largest thickness T710. The concentration of the p-type impurity ions in the lightly doped source/drain regions 320 is small, because the lightly doped source/drain regions 320 overlap with the second sections 720, which has a thickness T2 less than the thickness T1. The concentration of the p-type impurity ions in the heavily doped source/drain regions 330 is large, because the heavily doped source/drain regions 330 overlap with the third sections 730, which has a thickness less than the thickness T2.

In this step, portions of the semiconductor layer 300 that overlap with the fourth regions R4 of the photomask 10 are converted into heavily doped regions 340. Since the fourth regions R4 of the photomask 10 are not covered with the light-shielding pattern 110 or the translucent layer 120, the concentration of the p-type impurity ions in the heavily doped regions 340 is greater than that of the p-type impurity ions in the heavily doped source/drain regions 330. The heavily doped regions 340 of the semiconductor layer 300 are removed from the element substrate 200 by etching in a subsequent step.

Figure 8:
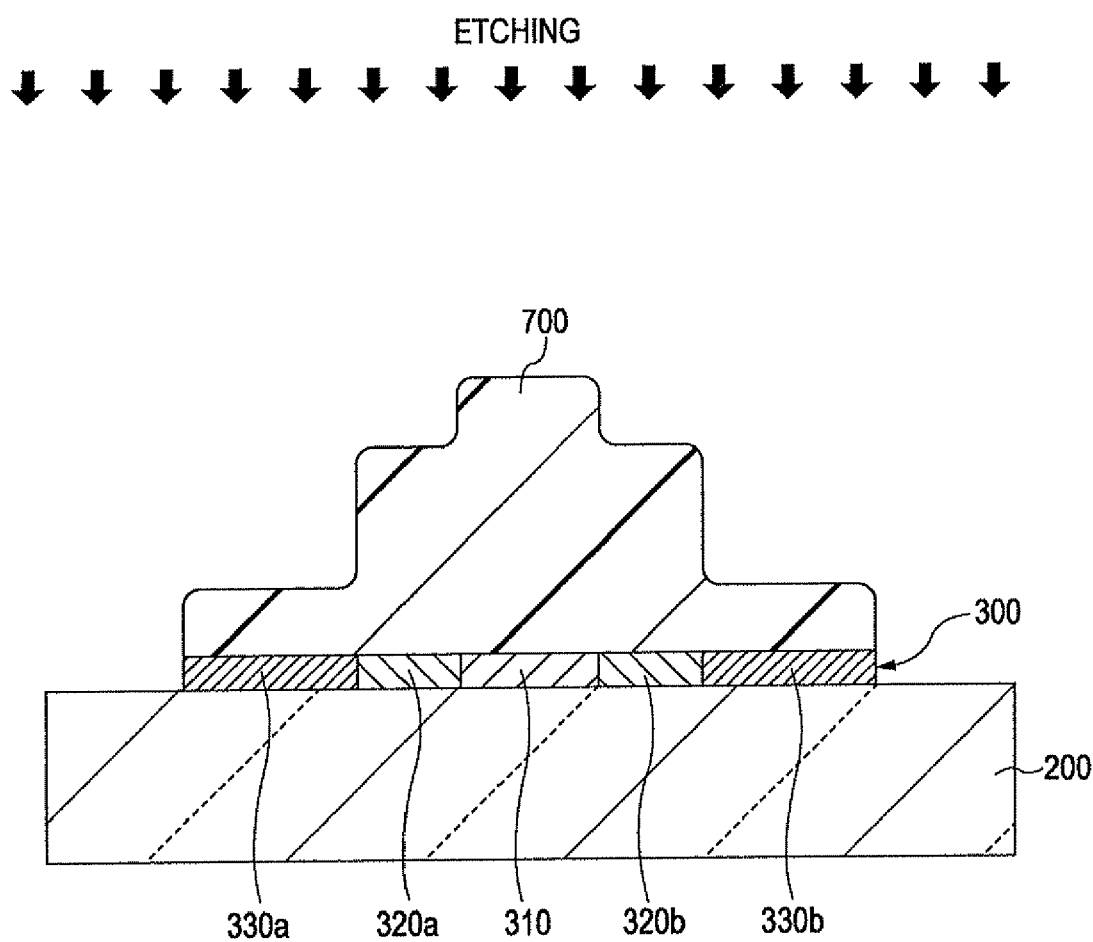
FIG. 8 is sectional view illustrating a step of a method for fabricating a thin-film transistor using the photomask according to the first embodiment.

In a step shown in FIG. 8, the heavily doped regions 340 is removed in such a manner that the semiconductor layer 300 is etched using the gradient resist film 700 as a mask, whereby the semiconductor layer 300 is patterned so as to have a predetermined pattern. Therefore, the method according to this embodiment includes a smaller number of steps as compared to a method that uses a resist layer, serving as a mask, for patterning the semiconductor layer 300 by etching in addition to the gradient resist film 700. The gradient resist film 700 is then removed.

Figure 9:
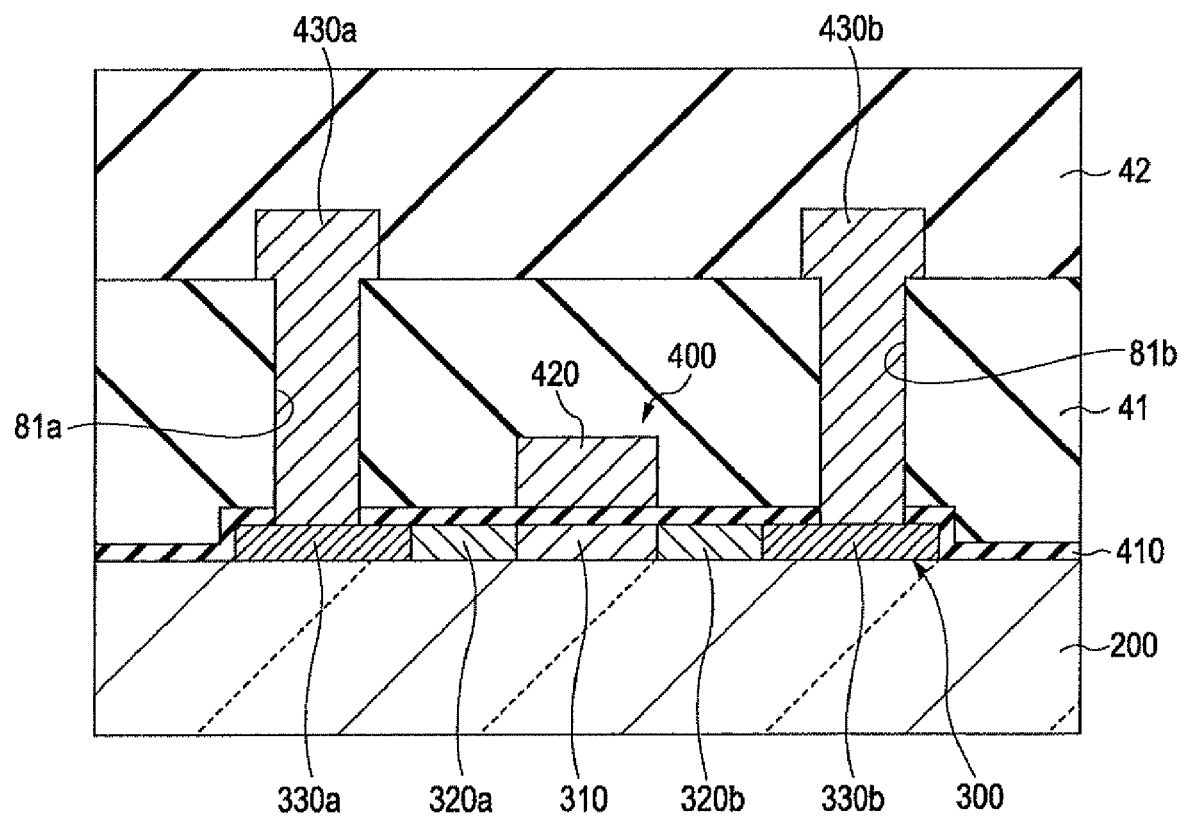
FIG. 9 is sectional view illustrating a step of a method for fabricating a thin-film transistor using the photomask according to the first embodiment.

In a step shown in FIG. 9, a gate-insulating layer 410 is formed over the semiconductor layer 300. A gate electrode 420 is formed on the first molding member 410 from, for example, a conductive polysilicon layer so as to overlap with the channel region 310. A first insulating layer 41 is formed over the element substrate 200. The following holes are formed so as to extend through the first insulating layer 41 and the gate-insulating layer 410: a first contact hole 81a for electrically connecting a source electrode 430a formed later to the heavily doped source region 330a of the semiconductor layer 300 and a second contact hole 81b for electrically connecting a drain electrode 430b formed later to the heavily doped drain region 330b of the semiconductor layer 300.

A metal layer made of a metal silicide or a low-resistance metal such as aluminum (Al) is deposited on the first insulating layer 41 by sputtering or the like. The metal layer is patterned by a photolithographic process, an etching process, or the like, whereby the source electrode 430a and the drain electrode 430b are formed. A second insulating layer 42 is formed over the element substrate 200.

By the above procedure, an n-type TFT 400 having an LDD structure is formed.

According to the thin-film transistor-fabricating method, the gradient resist film 700 can be precisely formed, because the resist layer 700a is exposed to light through the photomask 10 according to the first embodiment. Therefore, the concentration of the impurity ions in the semiconductor layer 300 can be precisely controlled in the step of implanting the impurity ions into the semiconductor layer 300 through the gradient resist film 700. This allows a process for fabricating the TFT 400 to have increased yield.

The thin-film transistor-fabricating method according to this embodiment can be used to manufacture an electro-optical apparatus such as a TFT active-matrix addressing liquid crystal apparatus or an organic electroluminescent (EL) apparatus.

The present invention is not limited to the above embodiments. Modifications may be made within the scope or spirit of the present invention as defined by the attached claims or specified in this specification. The present invention covers modifications of the above exposure masks and methods for fabricating thin-film transistors using such modified exposure masks.

What is claimed is:

1. An exposure mask comprising:
    a transparent substrate;
    a first pattern portion formed on the transparent substrate including at least one light-shielding pattern having a predetermined shape; and
    a translucent layer which is formed at a section including a first pattern region having the first pattern portion, which allows exposure light to pass therethrough, and which has a transmittance greater than that of the light-shielding pattern, wherein
    the translucent layer has an extending portion extending from a portion which is disposed on the transparent substrate and which overlaps with a region having the light-shielding pattern to at least one portion of a region which is disposed on the transparent substrate and which has no light-shielding pattern,
    the light-shielding pattern has a second pattern portion which is different from the first pattern portion and which is located at a second pattern region which is different from the first pattern region and which is disposed on the transparent substrate, the first and second portions having a transmittance, and
    the transmittance of the second pattern portion is less than a transmittance of the first pattern portion, and the transmittance of the first pattern portion is less than the transmittance of a third region disposed on the transparent substrate with no light-shielding pattern.

2. The exposure mask according to claim 1, wherein the first pattern portion corresponds to a striped or dotted repeating portion of the light-shielding pattern.

3. The exposure mask according to claim 1, wherein the area ratio of the second pattern portion to the second pattern region is greater than the area ratio of the first pattern portion to the first pattern region.

4. The exposure mask according to claim 1, wherein the second pattern portion extends over the second pattern region.

5. A method for fabricating a thin-film transistor, comprising:
    forming a gradient resist film by exposing a resist layer disposed on a semiconductor layer to exposure light through the exposure mask according to claim 1; and
    implanting impurity ions into the semiconductor layer through the gradient resist film.

6. The method according to claim 5, further comprising etching the semiconductor layer using the gradient resist film.

7. A method for fabricating a thin-film transistor, comprising:
    forming a gradient resist film by exposing a resist layer disposed on a semiconductor layer to exposure light through the exposure mask according to claim 3; and
    implanting impurity ions into the semiconductor layer through the gradient resist film.

8. A method for fabricating a thin-film transistor, comprising:
    forming a gradient resist film by exposing a resist layer disposed on a semiconductor layer to exposure light through the exposure mask according to claim 4; and
    implanting impurity ions into the semiconductor layer through the gradient resist film.

9. A method for fabricating a thin-film transistor, comprising:
    forming a gradient resist film by exposing a resist layer disposed on a semiconductor layer to exposure light through the exposure mask according to claim 2; and
    implanting impurity ions into the semiconductor layer through the gradient resist film.

10. The exposure mask according to claim 1, further comprising:
    a plurality of first pattern portions, and
    a plurality of extending portions.

* * * * *